United States Patent
Huang (10) Patent No.: US 8,159,072 B2
(45) Date of Patent: Apr. 17, 2012

(54) RECTIFICATION CHIP TERMINAL STRUCTURE

(76) Inventor: Wen-Huo Huang, Hsinchu County (TW)

(*) Notice: Subject to any disclaimer, the term of this patent is extended or adjusted under 35 U.S.C. 154(b) by 0 days.

(21) Appl. No.: 12/641,937

(22) Filed: Dec. 18, 2009

(65) Prior Publication Data

US 2010/0099302 A1 Apr. 22, 2010

Related U.S. Application Data

(63) Continuation-in-part of application No. 11/955,107, filed on Dec. 12, 2007, now abandoned.

(51) Int. Cl.
*H01L 23/06* (2006.01)
(52) U.S. Cl. ........ 257/774; 257/177; 257/684; 257/687; 257/688; 257/689; 257/E23.026; 257/E23.14; 363/144; 363/145
(58) Field of Classification Search ............. 257/177, 257/658–660, 687–690, 693–694, 717–719, 257/722, 727, 731, E23.045, E23.14, E23.186, 257/E23.121, E23.025, E23.125, E23.133, 257/E23.187, E23.078, E23.092, E21.358, 257/684, E23.026; 363/144, 145
See application file for complete search history.

(56) References Cited

U.S. PATENT DOCUMENTS

| | | | |
|---|---|---|---|
| 5,005,069 A | 4/1991 | Wasmer et al. | |
| 6,060,776 A | 5/2000 | Spitz et al. | |
| 6,667,545 B1* | 12/2003 | Spitz | 257/688 |
| 7,009,223 B1* | 3/2006 | Huang | 257/177 |
| 2004/0046246 A1* | 3/2004 | Cheng et al. | 257/706 |
| 2005/0082692 A1* | 4/2005 | Park et al. | 257/796 |
| 2006/0220218 A1 | 10/2006 | Sheen | |
| 2007/0105454 A1 | 5/2007 | Spitz et al. | |

* cited by examiner

Primary Examiner — Matthew Reames
Assistant Examiner — Ermias Woldegeorgis
(74) Attorney, Agent, or Firm — Muncy, Geissler, Olds & Lowe, PLLC (57) ABSTRACT

The present invention includes a base, a rectification chip, a conductive element and a coupling collar. The base has an installation pedestal to hold the rectification chip. The conductive element has a root portion to hold the rectification chip. The coupling collar is located at one end of the base to hold a package. The coupling collar has a plurality of anchor portions in contact with the package. Each anchor portion has a convex portion and a concave portion extended to two ends of the coupling collar. The convex portion and concave portion of two neighboring anchor portions are formed in a staggered manner. The cross section area of the convex portion on the annular edge of the coupling collar is different from the cross section area of the inner wall of the coupling collar. Hence fabrication and assembly are easier. Turning and loosening of the package can be prevented.

16 Claims, 9 Drawing Sheets

Fig. 6B

RECTIFICATION CHIP TERMINAL STRUCTURE

This application is a continuation-in-part, and claims priority, of from U.S. patent application Ser. No. 11/955,107 filed on Dec. 12, 2007 now abandoned, entitled "RECTIFICATION CHIP TERMINAL STRUCTURE".

FIELD OF THE INVENTION

The present invention relates to a rectification chip terminal structure and particularly to a rectification chip terminal for use on power rectifiers.

BACKGROUND OF THE INVENTION

The general rectification terminal mainly is used on electrodes of vehicle generators to transform AC power to DC power. Such type of terminal has a pedestal with a tin blade located thereon, and then a chip is mounted onto the tin blade. The tin is heated and melted to solder the chip on the pedestal. Finally the terminal is encased and packaged with plastics or resin. On the conventional rectification terminal the conductive element frequently deforms due to impact or stress of external forces. The design of the terminal also makes assembly and installation difficult.

U.S. Pat. No. 6,060,776 entitled "Rectifier diode" mainly includes a base which has a pedestal. The pedestal holds a semiconductor chip to be bonded to a head wire. The base has a protective sheath filled with a package to securely encase the pedestal and semiconductor chip in the space of the protective sheath. However, when the rectifier diode is pressed onto a rectifier sheet the juncture of the base and protective sheath easily deforms under forces. Hence the service life of the rectifier diode suffers. To remedy the aforesaid problem, U.S. patent application No. 20070105454 entitled "diode" provides a gap between the base and protective sheath so that a buffer room is provided during pressing of the diode onto a rectifier sheet to prevent deformation of the base.

Another U.S. Pat. No. 6,667,545 entitled "Rectifier diode with improved means for tension relief of the connected headwire" includes a press-fit base which has an extended securing region to hold a semiconductor chip. The semiconductor chip is bonded to a head wire. The securing region has a peripheral end portion and a collar. The collar and peripheral end portion form respectively an included angle α and α' with the axis of the head wire. The angle α is greater than the angle α' so that the surrounding of the semiconductor chip forms a passivation agent.

The conventional techniques mentioned above still have shortcomings. For instance, the rectification chip terminal generally is formed at a small size to save space. This also happens to the aforesaid conventional techniques. The small size creates many manufacturing problems, such as during soldering process the protective sheath is jutting over the base and forms interference that makes soldering more difficult. Product quality suffers. Installation also is more difficult. Manufacturing process is longer and takes more time. Moreover, the protective sheath has an inner wall perpendicular to the plane of the base. As a result the package easily breaks off during pouring.

SUMMARY OF THE INVENTION

The primary object of the present invention is to solve the aforesaid problems. The invention provides a rectification chip terminal that is easier to fabricate and can save production time and also prevent package from breaking off.

To achieve the foregoing object the rectification chip terminal according to the invention mainly includes a base, a rectification chip, a conductive element and a coupling collar. The base has an installation pedestal to hold the rectification ship which is surrounded by an insulation portion. The conductive element has a root portion extended to form a buffer section. The coupling collar is located at one end of the base to hold a package inside. The installation pedestal and the inner rim of the base are interposed by a gap. At least one hook portion is formed between the installation pedestal and the bottom of the gap. In addition, the coupling collar has a plurality of anchor portions formed thereon in contact with the package. Each anchor portion has a convex portion and a concave portion respectively extended to two ends of the coupling collar. The convex portion and the concave portion of two neighboring anchor portions are formed in a staggered manner. The cross section area of the convex portion on the annular edge of the coupling collar is different from the cross section area of the inner wall of the coupling collar.

Another object of the invention is to provide shock resistance for the conductive element by providing a buffer section on the conductive element to prevent the rectification chip from breaking when the conductive element is subject to external forces.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Please refer to FIGS. 1 through 3A, the rectification chip terminal structure according to the invention mainly includes a base 10, a rectification chip 20, a conductive element 30 and a coupling collar 40. The coupling collar 40 is located at one end of the base 10 to hold a package 42 (such as epoxy resin). The coupling collar 40 has a plurality of anchor portions 43 formed thereon in contact with the package 42. Each anchor portion 43 has a convex portion 431 and a concave portion 432 respectively extended to two ends of the coupling collar 40. The convex portion 431 and the concave portion 432 of two neighboring anchor portions 43 are formed in a staggered manner. The cross section area of the convex portion 431 on the annular edge of the coupling collar 40 is different from the cross section area of the inner wall of the coupling collar 40. Hence after the package 42 is cured, it does not break away from the coupling collar 40 and not turn relative to the coupling collar 40. In an embodiment shown in the drawings, the cross section area of the convex portion 431 on the annular edge of the coupling collar 40 is smaller than the cross section area of the inner wall of the coupling collar 40 (referring to FIG. 3A), or may be the cross section area of the convex portion 431 on the annular edge of the coupling collar 40 is greater than the cross section area of the inner wall of the coupling collar 40 (referring to FIG. 3B), while the cross section area of the concave portion 432 remains the same. The inner wall of the coupling collar 40 is formed in an arched shape. The base 10 has an installation pedestal 11 formed with a coarse surface at coarseness of 0.6 Ra, and a first bulged structure 12 in the center to hold the rectification chip 20. The rectification ship 20 is surrounded by an insulation portion 21 at the perimeter. In this embodiment the insulation portion 21 is formed at a height slightly greater than a package glass of the rectification chip 20 to insulate the rectification ship 20 from forming a short circuit. The installation pedestal 11 and the base 10 are interposed by a gap 14 to prevent moisture from seeping through the inner wall, and also prevent the chip 20 from broken caused by the stress of the package 42. At least one hook portion 13 is formed between the installation pedestal 11 and the bottom of the gap 14. As shown in the drawings, the hook portion 13 may be a plurality of non-continuous curves to latch the package 42 from loosening off, and also prevent the base 10 from turning against the package 42. The conductive element 30 has a root portion 31 which has a second bulged structure 32 at one side connecting to the rectification ship 20.

Figure 1:
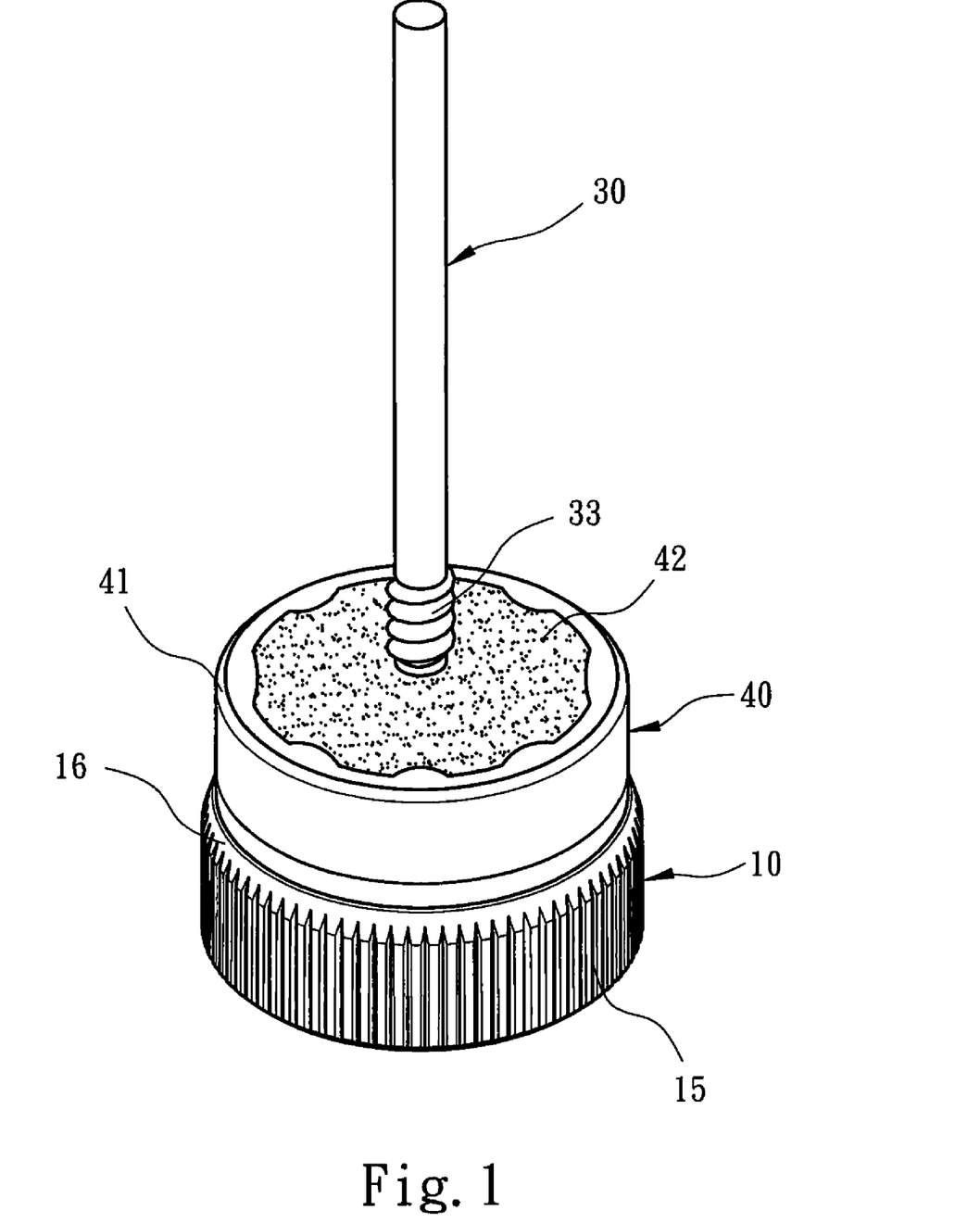
FIG. 1 is a perspective view of the invention.
Figure 2A:
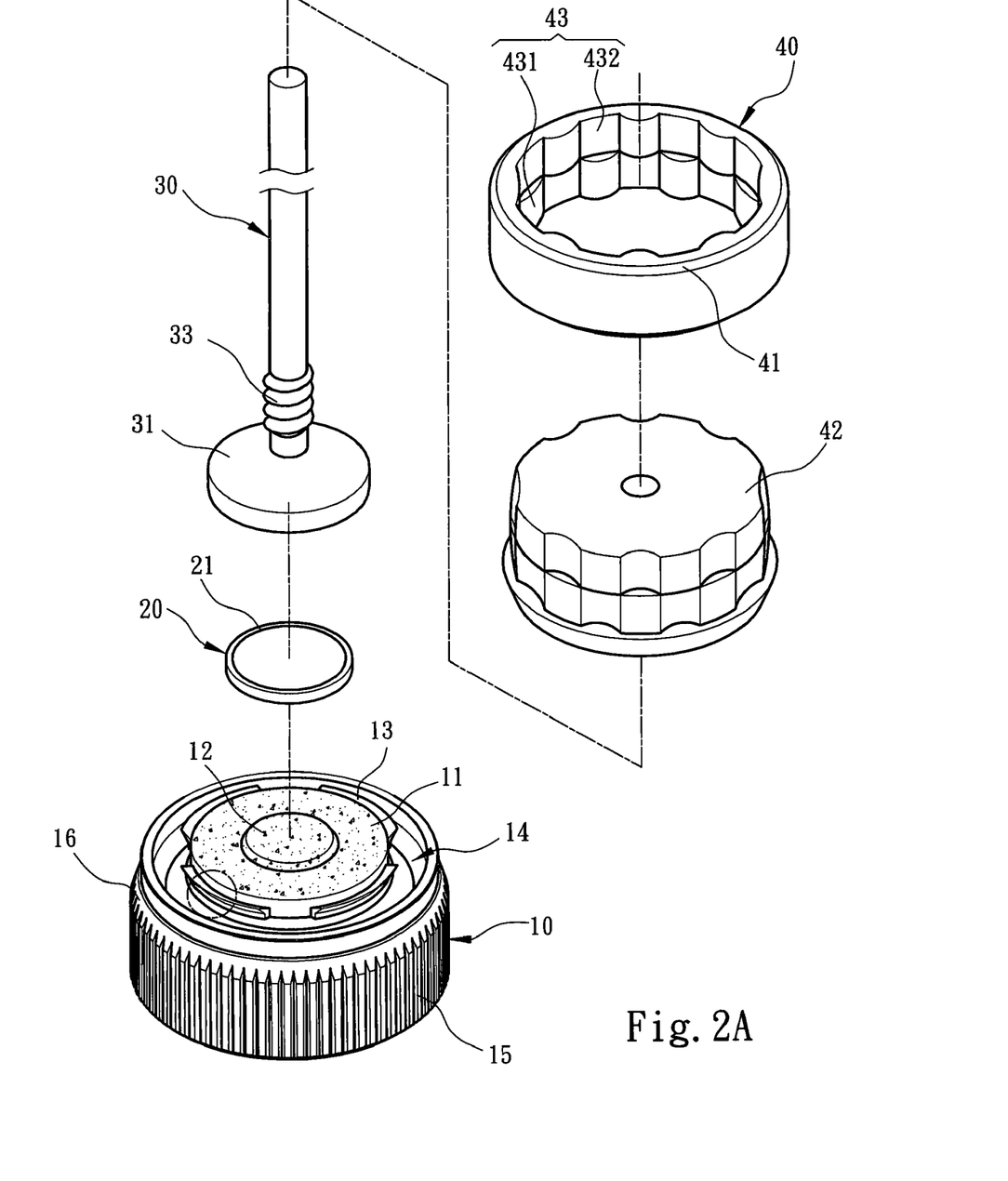
FIG. 2A is an exploded view of the invention.
Figure 2B:
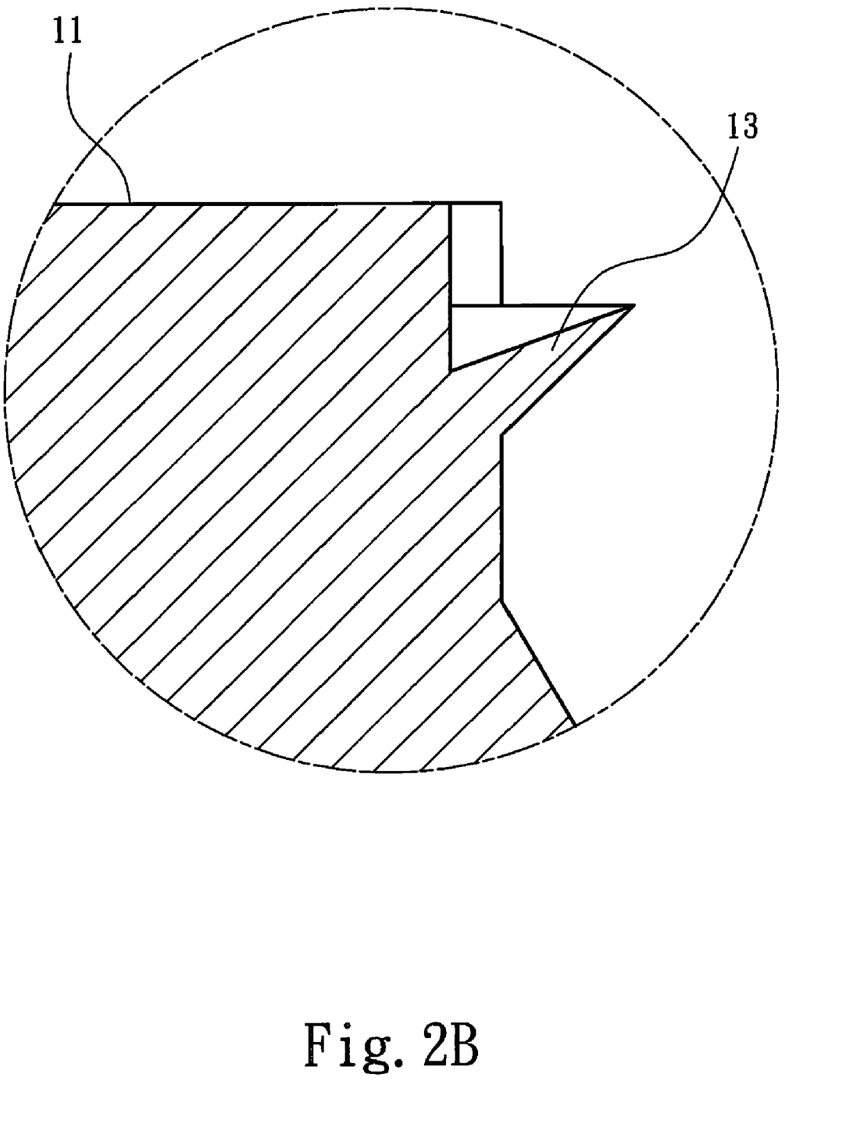
FIG. 2B is an enlarged fragmentary sectional view according to FIG. 2A.
Figure 3A:
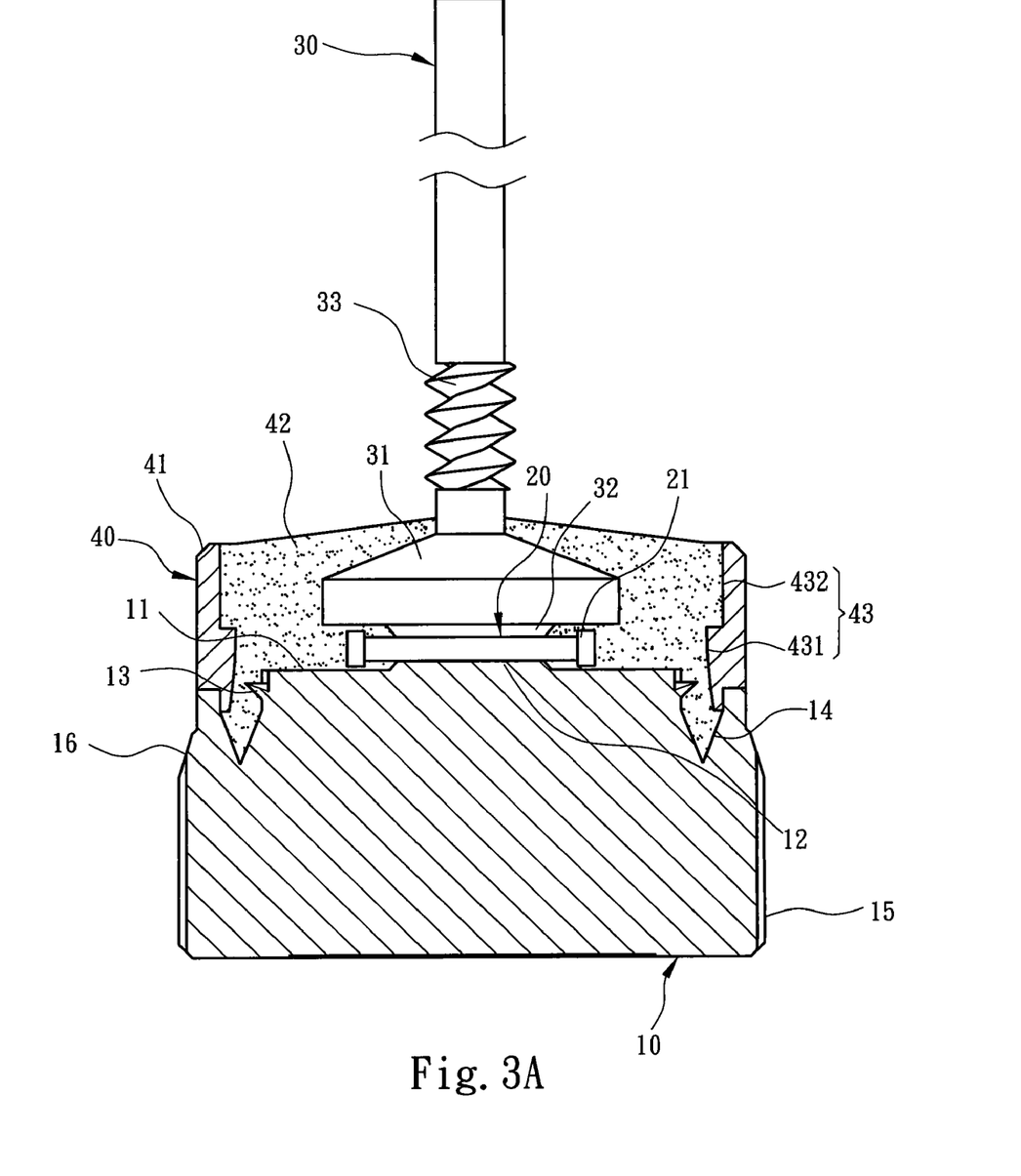
FIGS. 3A and 3B are sectional views of the invention.
Figure 3B:
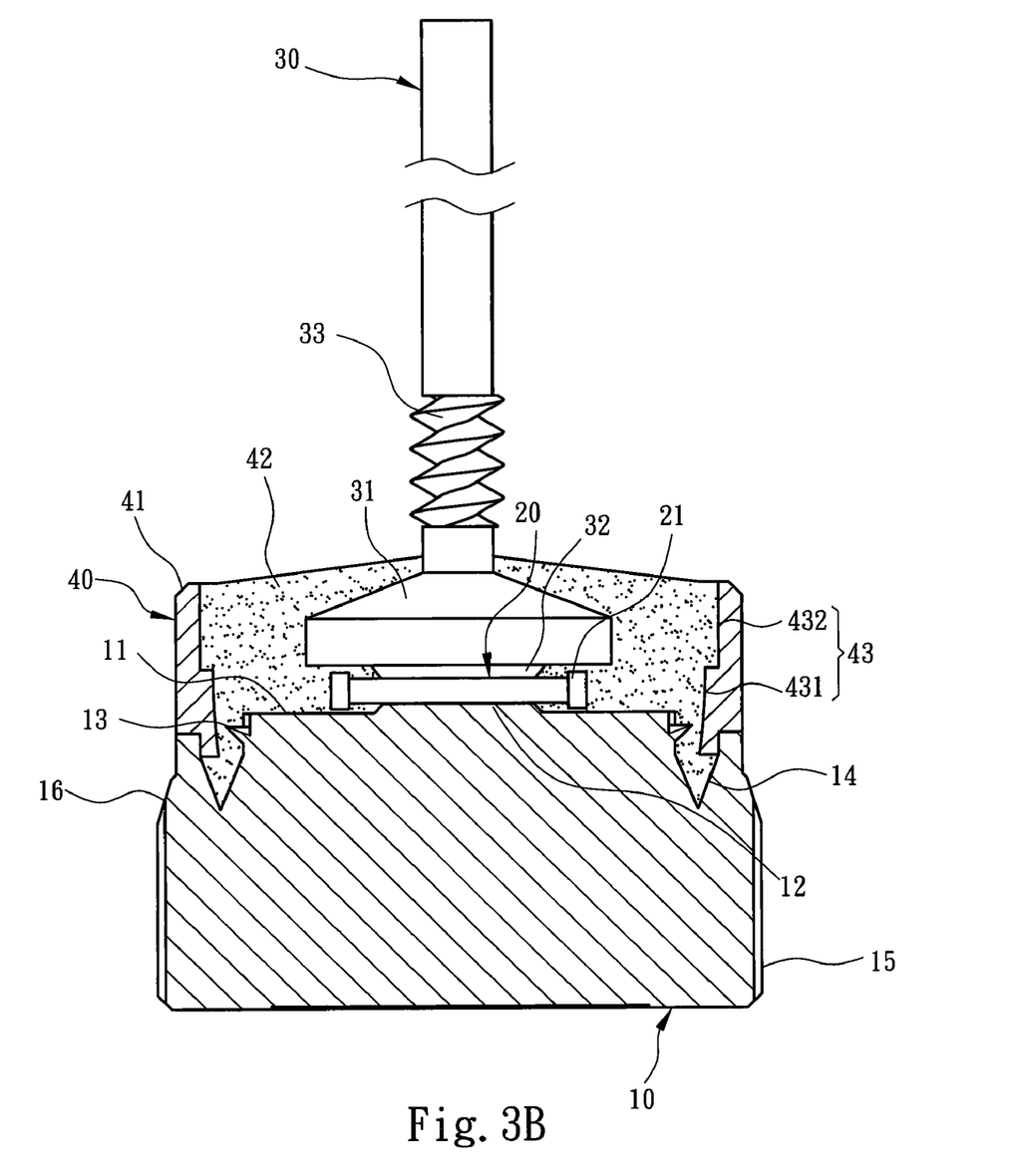

For assembly, the rectification chip 20 and the second bulged structure 32 of the conductive element 30 are soldered on the first bulged structure 12 of the installation pedestal 11 in this order. The coarse surface can increase the bonding force of the rectification chip 20 and the base 10, and also prevent the solder from spilling out through the circumference of the rectification chip 20 during bonding; next, the coupling collar 40 and the base 10 are screwed or bonded together; then pour the package 42 in the coupling collar 40; finally cure the package 42 to form a finished product of the rectification chip terminal structure. By separating the design of the coupling collar 40 and the base 10, a greater maneuvering space is available for the soldering process. Fabrication time can be reduced. By connecting the rectification chip 20 at two sides through the first and second bulged structures 12 and 32 a corresponding space is formed respectively at the two sides, damages caused by breaking or squeezing of the insulation portion 21 resulting from heat expansion of the package 42 also can be prevented. The conductive element further has a buffer section 33 extended from another side of the root portion 31. Such a structure provides a shock resistant cushion when subject to external forces so that breaking of the rectification chip 20 caused by excessive external forces can be avoided. Moreover, because the cross section area of the convex portion 431 on the annular edge of the coupling collar 40 is different from the cross section area of the inner wall of the coupling collar 40, and the hook portion 13 inclines outwards from the axis, the package 42 is confined in the coupling collar 40 without escaping or turning. In addition, the base 10 has a first chamfered angle 16 and the coupling collar 40 has a second chamfered angle 41 to direct the coupling angle of the rectification chip terminal and a targeted bonding object. The base 10 further has a grasping portion 15 which has a plurality of spaced and embossed traces formed on the periphery.

Figure 4:
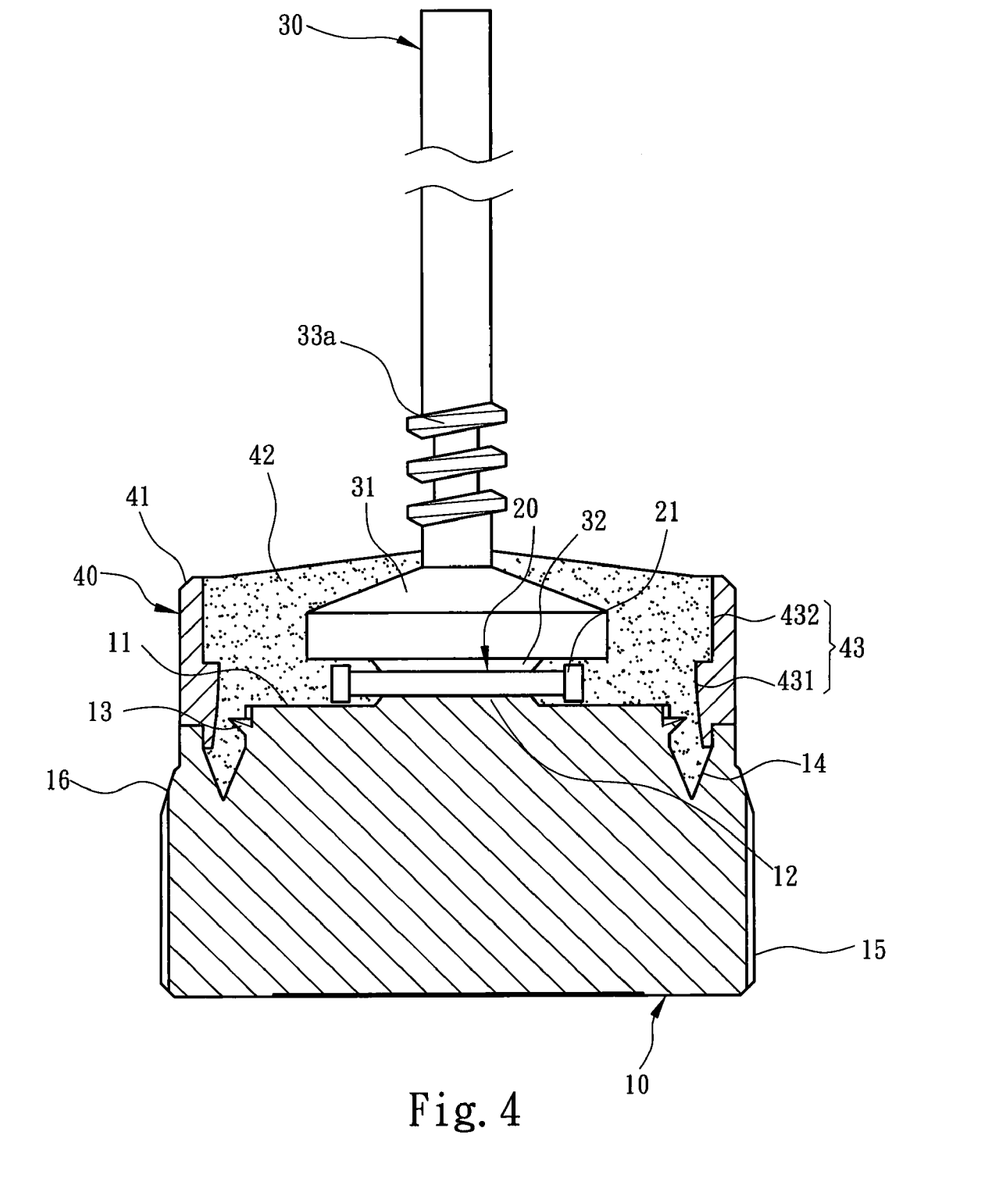
FIG. 4 is a schematic view of another embodiment of the invention.
Figure 5:
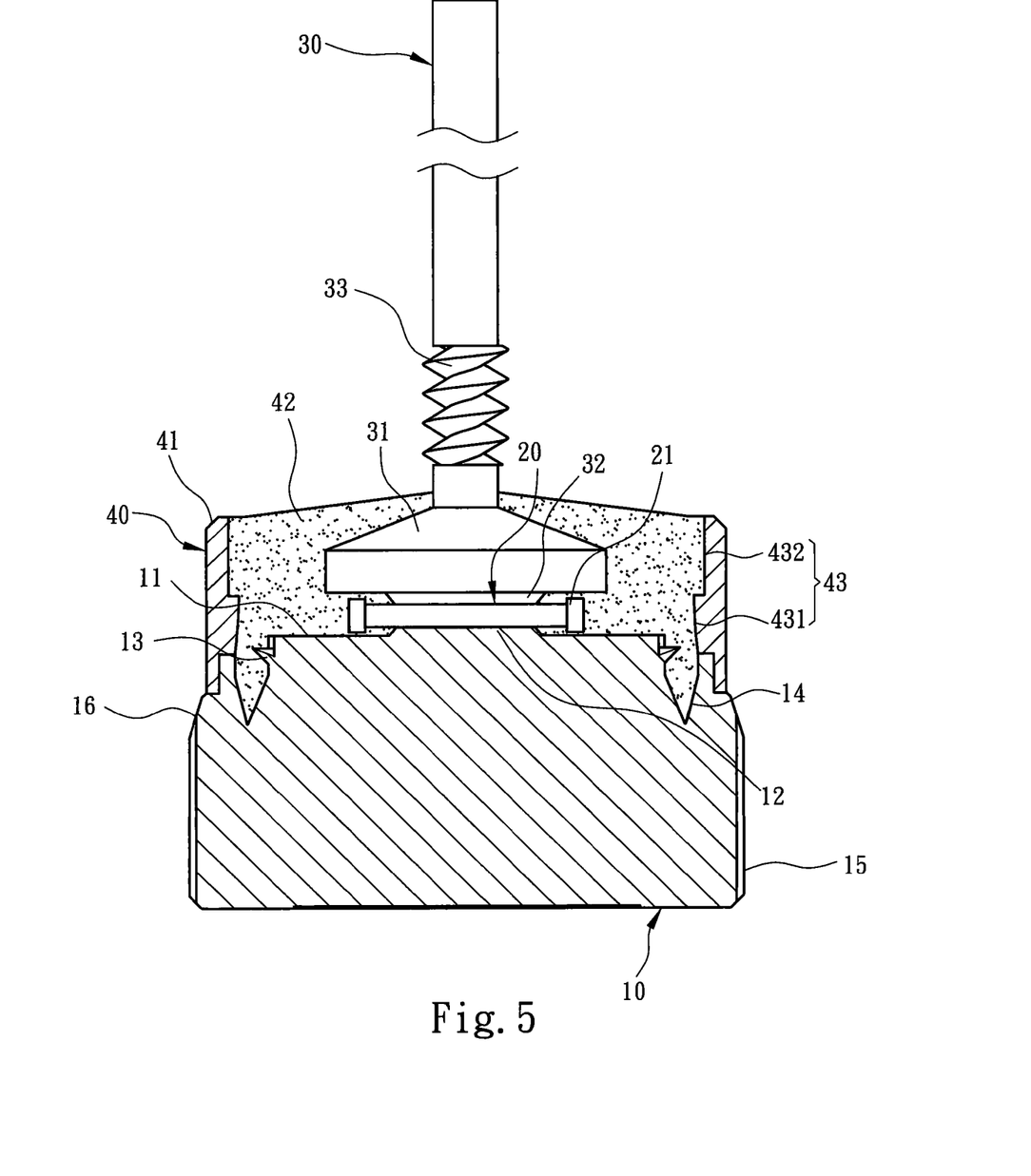
FIG. 5 is a schematic view of yet another embodiment of the invention.
Figure 6A:
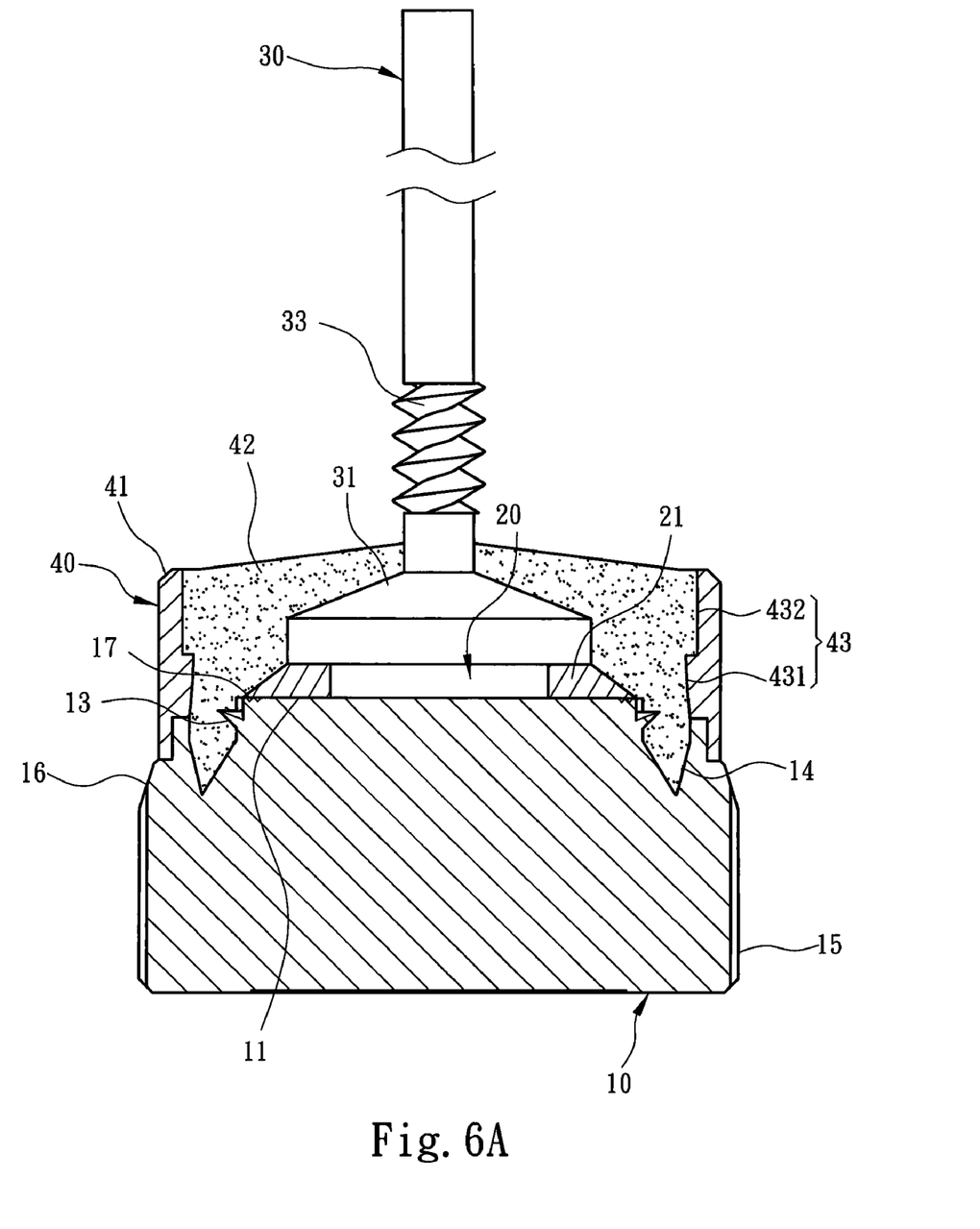
FIG. 6A is a schematic view of still another embodiment of the invention.
Figure 6B:
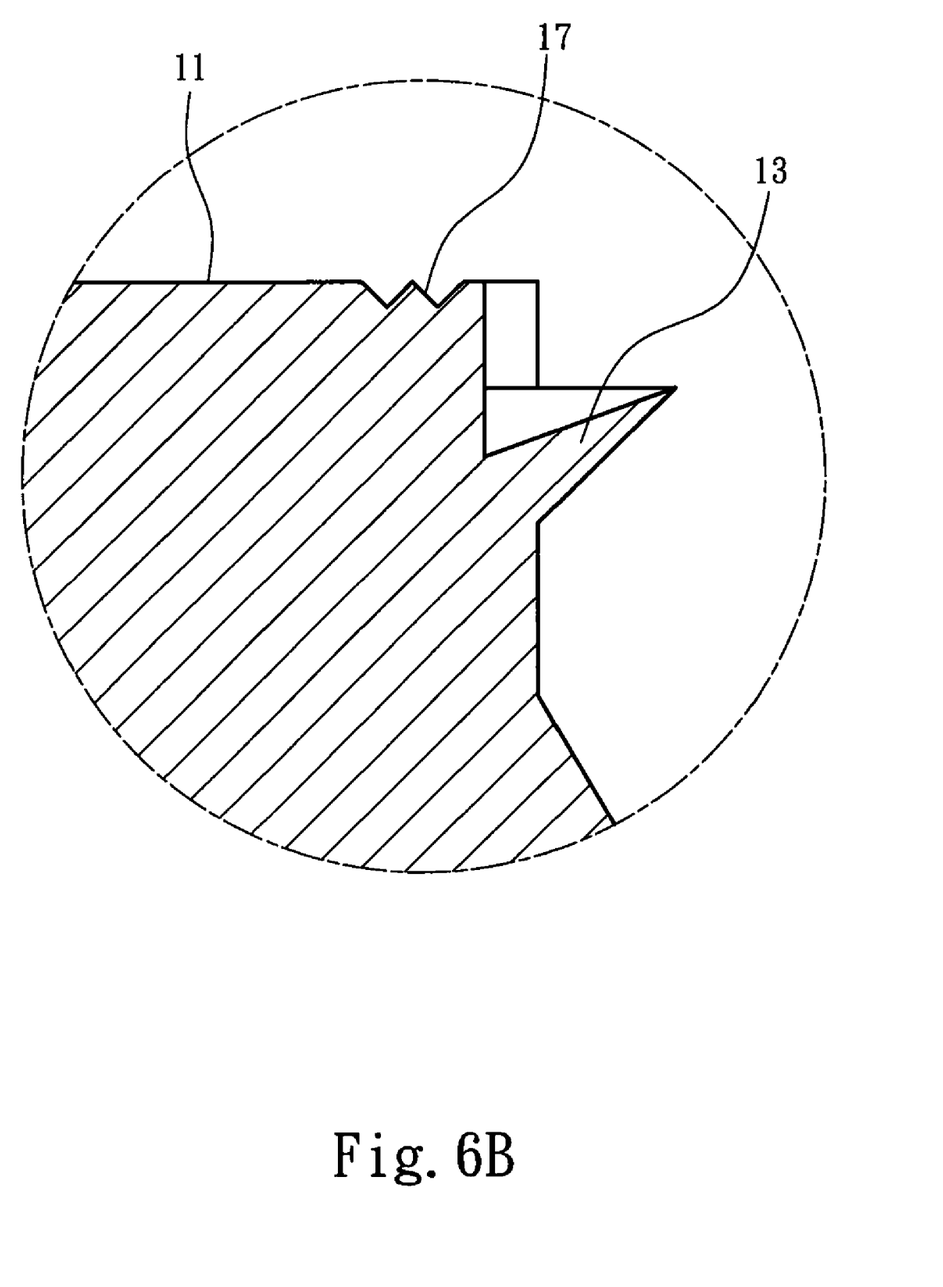
FIG. 6B is an enlarged fragmentary view according to FIG. 6A.

In the embodiments of the invention, the coupling collar 40 is coupled with an inner rim of the base 10 through an outer peripheral edge thereof (referring to FIG. 3A), or with an outer rim of the base 10 through an inner peripheral edge thereof (referring to FIG. 5). The buffer section 33 of the conductive element 30 may be formed with dense screw threads or a buffer section 33a formed with spaced screw threads (referring to FIG. 4). The inner pitch diameter of the thread portion of the buffer section 33a is smaller than the conductive element 30. Thus when the conductive element 30 is subject to external forces the buffer sections 33 and 33a provide shock resistance and cushion to prevent the rectification chip 20 from being damaged by the external forces. Referring to FIGS. 6A and 6B, the insulation portion 21 may be an insulation rubber. The installation pedestal 11 has a blocking trench 17 to anchor the insulation rubber. By filling the insulation rubber between the conductive element 30 and the installation pedestal 11 to encase the rectification chip 20, short circuit of the rectification chip 20 can be prevented.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A rectification chip terminal structure, comprising:
    a base containing an installation pedestal which is spaced from an inner rim of the base by a gap and has at least one hook portion spaced from the bottom of the gap;
    a rectification chip which is mounted onto the installation pedestal and has an insulation portion at the periphery thereof;
    a conductive element which includes a root portion to hold the rectification chip and a buffer section extended from the root portion; and
    a coupling collar which is located at one end of the base to hold a package and includes a plurality of anchor portions on an inner surface to contact with the package, each of the anchor portions containing a convex portion and a concave portion in a direction from the base to the conductive element the anchor portions being adjacent to each other around the inner surface of the coupling collar so that a convex portion of each anchor portion is horizontally adjacent to a concave portion of each adjacent anchor portion, a cross section area of the convex portion on the annular edge of the coupling collar being different from the cross section area of the inner edge of the coupling collar.

2. The rectification chip terminal structure of claim 1, wherein the installation pedestal is a coarse surface.

3. The rectification chip terminal structure of claim 2, wherein the coarse surface has coarseness of 0.6Ra.

4. The rectification chip terminal structure of claim 1, wherein the installation pedestal contains a first bulged structure connecting to the rectification chip.

5. The rectification chip terminal structure of claim 1, wherein the root portion contains a second bulged structure connecting to the rectification chip.

6. The rectification chip terminal structure of claim 1, wherein the insulation portion is formed at a thickness greater than a package glass of the rectification chip.

7. The rectification chip terminal structure of claim 1, wherein the insulation portion is an insulation rubber, the installation pedestal containing at least one blocking trench to anchor the insulation rubber which fills between the conductive element and the installation pedestal and encases the rectification chip.

8. The rectification chip terminal structure of claim 1, wherein the buffer section contains screw threads formed densely.

9. The rectification chip terminal structure of claim 1, wherein the buffer section contains spaced screw threads which have an inner pitch diameter smaller than the outer diameter of the conductive element.

10. The rectification chip terminal structure of claim 1, wherein the cross section area of the convex portion on the annular edge of the coupling collar is greater than the cross section area of the inner wall of the coupling collar.

11. The rectification chip terminal structure of claim 1, wherein the cross section area of the convex portion on the annular edge of the coupling collar is smaller than the cross section area of the inner wall of the coupling collar.

12. The rectification chip terminal structure of claim 1, wherein the concave portion forms a consistent cross section area.

13. The rectification chip terminal structure of claim 1, wherein the inner wall of the coupling collar is formed an arched surface.

14. The rectification chip terminal structure of claim 1, wherein the base has a first chamfered angle.

15. The rectification chip terminal structure of claim 1, wherein the coupling collar has a second chamfered angle.

16. The rectification chip terminal structure of claim 1, wherein the base contains a grasping portion which has a plurality of spaced and embossed traces formed on the periphery.

* * * * *